(12) United States Patent
Tominaga

(10) Patent No.: US 6,677,617 B2
(45) Date of Patent: Jan. 13, 2004

(54) SEMICONDUCTOR LED COMPOSED OF GROUP III NITRIDED EMISSION AND FLUORESCENT LAYERS

(75) Inventor: Kouji Tominaga, Hirakata (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/984,604

(22) Filed: Oct. 30, 2001

(65) Prior Publication Data

US 2003/0080343 A1 May 1, 2003

(51) Int. Cl.[7] ............................................. H01L 33/00
(52) U.S. Cl. ............................. 257/88; 257/89; 257/90; 257/94; 257/96; 257/12; 257/13; 257/14
(58) Field of Search ........................... 257/12, 13, 14, 257/25, 88, 89, 90, 94, 96, 97, 104, 106

(56) References Cited

U.S. PATENT DOCUMENTS 5,976,412 A * 11/1999 Itoh et al.

6,365,911 B1 * 4/2002 Furuyama

FOREIGN PATENT DOCUMENTS

| JP | 9-232627 | 9/1997 |
| JP | 10-97200 | 4/1998 |

* cited by examiner

*Primary Examiner*—Fetsum Abraham
(74) *Attorney, Agent, or Firm*—Westerman, Hattori, Daniels & Adrian, LLP

(57) ABSTRACT

This invention provides a light-emitting diode which is capable of extracting white light, manufactured readily and highly reliable. The light-emitting diode is fabricated by laminating a buffer layer 2, an Si (silicon)-doped GaN fluorescent layer 3, an n-GaN layer 4, an MQW emission layer 5 and a p-GaN layer 6 on a sapphire substrate 1 in this order. The Si-doped GaN fluorescent layer 3 is doped higher concentration of Si (silicon) than a conventional Si-doped GaN layer with sufficient good crystallinity. Such a Si-doped GaN fluorescent layer is excited by blue light generated in the MQW emission layer and emits yellow light. The yellow light is the complement for the blue light generated in the MQW emission layer. White light can be obtained by blending and extracting both of blue light and yellow light.

9 Claims, 3 Drawing Sheets light light

SEMICONDUCTOR LED COMPOSED OF GROUP III NITRIDED EMISSION AND FLUORESCENT LAYERS

BACKGROUND OF THE INVENTION

1. Field of the Invention

The invention relates to a semiconductor light-emitting device comprising of a group III–V nitride base semiconductor (hereafter referred to as a nitride base semiconductor) such as BN(boron nitride), GaN(gallium nitride), AlN (aluminum nitride), InN(indium nitride), TlN(thallium nitride), or crystal mixtures of these nitrides, and capable of emitting white light, and a method of fabricating the semiconductor light-emitting device.

2. Description of Prior Art

White light-emitting devices using light-emitting diodes are under development in order to invent a white light source having a low power consumption, high reliability and a long-life.

For example, a light-emitting device in which three light-emitting diodes emitting light beams of primary colors, red, green and blue respectively are arranged on one stem has been known. Such a light-emitting device is capable of emitting white light by blending red light, green light and blue light emitted from each light-emitting diode.

JP 232627/1997 A discloses a light-emitting diode in which three emission layers emitting red light, green light and blue light respectively are formed on one substrate. Such a light-emitting diode can emit white light by blending light beams of three colors emitted from each emission layer.

Also JP 97200/1998 A discloses a method for obtaining white light by incorporating a fluorescent material into a light-emitting diode emitting blue light. In this case, for example, the fluorescent material such as YAG based materials is coated over a surface of a GaN base light-emitting diode emitting blue light in a resin molding process.

The other method also has been known that ZnSe base light-emitting diode can obtain white light by blending blue light emitted from an emission layer composed of ZnSe base material and yellow fluorescence emitted from ZnSe substrate.

The above mentioned light-emitting device comprising three light-emitting diodes emitting light of three different colors respectively requires a plurality of light-emitting diodes to obtain white light. Thus the fabricating process of the device is complicated, resulting in time-consuming and costly manufacturing process.

As to the light-emitting diode having three emission layers in JP 232627/1997 A, the fabricating process of three emission layers is complicated, resulting in time-consuming and costly manufacturing process. In addition, the emission layer composed of InGaN needs to contain a large proportion of In composition in order to emit red light, but such an emission layer is difficult to grow.

As to the method of obtaining white light by incorporating the fluorescent material into the light-emitting diode, disclosed in JP 97200/1998 A, the method needs not only a growing process of semiconductor layers but also a coating process of the fluorescent material. Such a light-emitting diode requires complicated fabricating processes, resulting in time-consuming and costly manufacturing process.

As to the ZnSe base white light-emitting diode fabricated by combining the ZnSe base emission layer emitting blue light and the ZnSe substrate emitting yellow fluorescence, the ZnSe material suffers serious deterioration caused by continued energization, therefore, such a light-emitting diode has a short-life and a low reliability.

SUMMARY OF THE INVENTION

It is an object of the invention to provide a semiconductor light-emitting device which is capable of extracting white light, manufactured readily and highly reliable, and a method of fabricating the device.

A semiconductor light-emitting device according to the invention comprises an emission layer composed of a group III nitride base semiconductor and generating light by carrier injection, and a fluorescent layer composed of the group III nitride base semiconductor and generating light by excitation from the light generated in the emission layer. The light generated in the emission layer is different in a peak wavelength from the light generated in the fluorescent layer.

The semiconductor light-emitting device of the present invention can readily emit white light by blending the light from the emission layer and the light from the fluorescent layer and extracting the blended light, due to the difference in the peak wavelength of both lights.

In manufacturing the semiconductor light-emitting device, the emission layer and the fluorescent layer can be grown in sequence in a same way. Therefore, manufacturing the semiconductor light-emitting device is readily, resulting in high yield and a low cost.

Also the semiconductor light-emitting device comprises the emission layer and the fluorescent layer composed of the group III nitride base semiconductors, which are chemically stable materials. Because of this, the emission layer and the fluorescent layer can be energized without deterioration. Therefore, the semiconductor light-emitting device with a long life and a high reliability can be realized.

It is preferable that the light from the emission layer and the light from the fluorescent layer make a color complement to each other. In this case, white light emission can be obtained by mixing the light from the light-emission layer and the light from the fluorescent layer and extracting the mixed light.

It is also preferable that the emission layer and the fluorescent layer are arranged so that the light generated in the emission layer passes through the fluorescent layer. Consequently, the light generated in the emission layer is mixed with the light generated in the fluorescent layer, obtaining white light.

The emission layer may be formed on the fluorescent layer so that the light from the emission layer and the light from the fluorescent layer are extracted from the fluorescent layer's side. Conversely, the fluorescent layer may be formed on the emission layer so that the light from the emission layer and the light from the fluorescent layer are extracted from the fluorescent layer's side.

As to the semiconductor light-emitting device including the fluorescent layer on the emission layer, at first, the emission layer having good crystallinity is formed, and next, the fluorescent layer is formed thereon. In such a semiconductor light-emitting device, the emission layer is not affected by crystallinity of the fluorescent layer, maintaining good crystalline state. Therefore, properties of the semiconductor light-emitting device can be improved.

The group III nitride base semiconductor may include at least one of aluminum, gallium, and indium. The emission layer containing the group III nitride base semiconductor may have an arbitrary emission wavelength in a range between 380–650 nm by controlling the composition in the group III nitride base semiconductor. Then, the composition is so controlled that the fluorescent layer emits light having a wavelength complemented in color for light generated in the emission layer.

The fluorescent layer may be composed of a silicon-doped gallium nitride. The silicon-doped nitride gallium of the fluorescent layer is doped with a higher concentration of silicon than a silicon-doped gallium nitride having sufficient good crystallinity, so the fluorescent layer including such a silicon-doped gallium nitride has good fluorescent properties. When the fluorescent layer is excited by light generated in the emission layer, the fluorescent layer generates intensive yellow light with a wavelength in a range between approximately 550–650 nm. Because the yellow light is the complement in color for light generated in the emission layer, white light can be obtained by mixing both lights and extracting the mixed light.

A fluorescent layer may be composed of a carbon-doped gallium nitride. The fluorescent layer including nitride gallium doped with carbon has good fluorescent properties. When the fluorescent layer is excited by light generated in the emission layer, the fluorescent layer generates intensive yellow light with a wavelength in a range between approximately 550–650 nm. Because the yellow light is the complement in color for light generated in the emission layer, white light can be obtained by mixing both lights and extracting the mixed light.

A fluorescent layer may be composed of an undoped gallium nitride. In the growth process, the fluorescent layer is supplied with source gas in which proportion of Nitrogen element and Gallium element to the source gas is set lower than that of the source gas supplied to a fluorescent layer with sufficient good crystallinity, therefore the fluorescent layer has good fluorescent properties. When the fluorescent layer is excited by the light generated in the emission layer, the fluorescent layer generates intensive yellow light with a wavelength in a range between approximately 550–650 nm. Because the yellow light is the complement in color for light generated in the emission layer, white light can be obtained by mixing both lights and extracting the mixed light.

A method of fabricating a semiconductor light-emitting device according to the present invention includes a process of forming an emission layer composed of a group III nitride base semiconductor and emitting light by carrier injection and a process of forming a fluorescent layer composed of a group III nitride base semiconductor, being excited by light from the emission layer and emitting light having a peak wavelength different from that of light generated in the emission layer.

The semiconductor light-emitting device fabricated through the method of the invention can readily obtain white light emission, due to the difference in the peak wavelength between light from the emission layer and light from the fluorescent layer, by mixing both lights and extracting the mixed light.

According to the fabricating method of the semiconductor light-emitting device, the emission layer and the fluorescent layer can be grown in sequence in the same way. Therefore, manufacturing the semiconductor light-emitting device is easy, resulting in high yield and a low cost.

Also the semiconductor light-emitting device fabricated through the above described method comprises the emission layer and the fluorescent layer composed of the group III nitride base semiconductors, which are chemically stable materials. Because of this, the emission layer and the fluorescent layer can be energized without deterioration. Therefore, the method in the invention can realize the semiconductor light-emitting device with a long life and high reliability.

It is preferable that light from the emission layer and light from the fluorescent layer make a color complement to each other. Consequently, white light emission can be obtained by mixing the light from the light-emission layer and the light from the fluorescent layer and extracting the mixed light.

Processes of forming the fluorescent layer may include a process of doping silicon to the group III nitride base semiconductor. A concentration of silicon to be doped may be so set that the III nitride base semiconductor exhibits fluorescent properties. Further processes of forming the fluorescent layer may include a process of doping carbon to the III nitride base semiconductor. Furthermore, processes of forming the fluorescent layer may include a process of supplying source gas including Nitrogen element and group III elements. The proportion of Nitrogen element and the group III elements in source gas may be so set that the group III nitride base semiconductor exhibits fluorescent properties.

According to the above mentioned methods, it is possible to form the fluorescent layer with good fluorescent properties.

The group III nitride base semiconductor may include at least one of aluminum, gallium, and indium. An emission layer composed of such a group III nitride base semiconductor can be set to emit an arbitrary emission wavelength in a range between 380–650 nm by controlling the proportion of the compositions in the group III nitride base semiconductor. The compositions are so controlled that the fluorescent layer emits light which is the complement for light emitted from the emission layer.

The foregoing and other objects, features, aspects and advantages of the present invention will become more apparent from the following detailed description of the present invention when reviewed in conjunction with the accompanying drawings.

DESCRIPTION OF PREFERRED EMBODIMENTS

Now a description is made about a light-emitting diode as a semiconductor light-emitting device of the present invention as follows.

Figure 1:
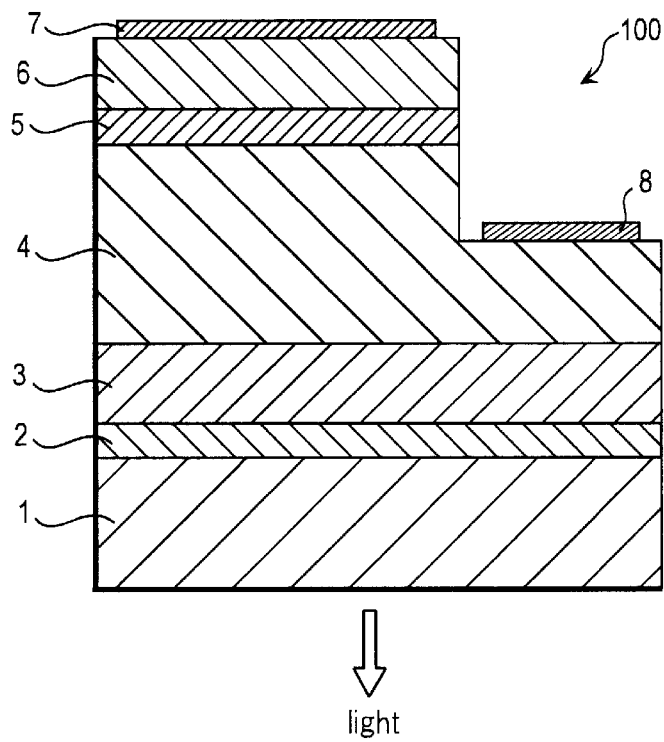
FIG. 1 is a cross sectional view schematically illustrating a light-emitting diode in a first embodiment according to the present invention.

FIG. 1 is a cross sectional view schematically illustrating a light-emitting diode in a first embodiment according to the present invention.

A light-emitting diode 100 shown in FIG. 1 is fabricated by growing layers 2–6 (as will be described later) on a sapphire substrate 1 by MOCVD (Metal Organic Chemical Vapor Deposition) method.

Specifically, a buffer layer 2 composed of $Al_{0.5}Ga_{0.5}N$ is grown to about 15 nm in thickness on C (0001) surface of the sapphire substrate 1. An Si(Silicon)-doped GaN fluorescent layer 3 of 1 μm in thickness is formed on the buffer layer 2.

The Si-doped GaN fluorescent layer 3 is doped excessive amount of Si by increasing a flow of silane gas ($SiH_4$), compared with the conventional Si-doped GaN fluorescent layer. Such a Si-doped GaN fluorescent layer 3 exhibits good fluorescent properties.

Figure 2:
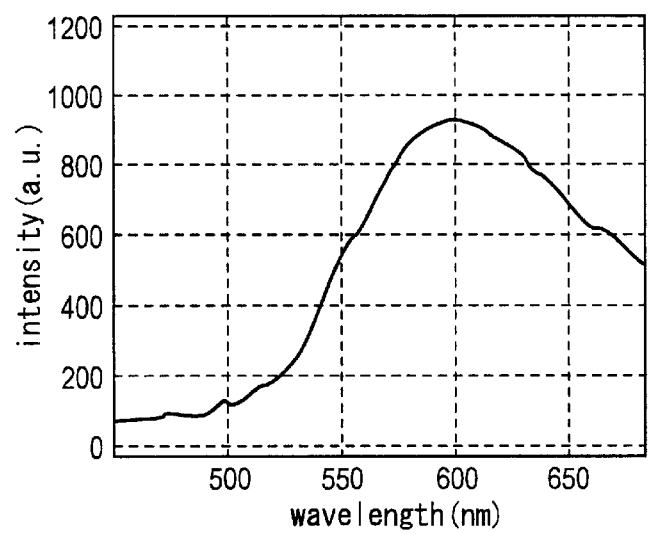
FIG. 2 illustrates a spectrum of a fluorescence of a fluorescent layer when the layer is irradiated with He—Cd laser light of 325 nm in a wavelength.

When the above described Si-doped GaN fluorescent layer 3 is irradiated by He—Cd laser of 325 nm in wavelength and excited, the Si-doped GaN fluorescent layer 3 generates yellow fluorescence having a broad spectrum around 600 nm in wavelength as shown in FIG. 2.

Then, an n-GaN layer 4 composed of Si-doped GaN is grown to 3 μm in thickness on the Si-doped GaN fluorescent layer 3. Further, an MQW (multiple quantum well) emission layer 5 composed of InGaN is grown on the n-GaN layer 4.

The MQW emission layer 5 has a multiple quantum well (MQW) structure in which five undoped GaN barrier layers about 6 nm in thickness each, and four undoped $In_{0.15}Ga_{0.85}N$ well layers about 3 nm in thickness each are laminated alternately.

Then, a p-GaN layer 6 composed of Mg-doped GaN is grown to 0.2 μm in thickness on the MQW emission layer 5.

Although the p-GaN layer 6 is formed on the MQW emission layer 5 in this embodiment, the p-GaN layer 6 may also be formed on the p-AlGaN layer composed of Mg-doped AlGaN formed on the MQW emission layer 5.

Further, predetermined regions on the p-GaN layer 6 are masked with $SiO_2$ films. The regions, which are not masked, on the p-GaN layer 6 reaching to the n-GaN layer 4 are removed to expose the n-GaN layer 4. Then, $SiO_2$ films as masks are removed by hydrofluoric acid base etchant.

Then, an n-side electrode 8 is formed on the exposed n-GaN layer 4 by laminating, for example, a Ti film of 10 nm in thickness and an Al film of 500 nm in thickness in this order. And a p-side electrode 7 is formed on the p-GaN layer 6 by laminating, for example, a Pd film of 30 nm in thickness and an Au film of 500 nm in thickness in this order.

As described above, the light-emitting diode 100 comprising the MQW emission layer 5 and the Si-doped GaN fluorescent layer 3 is fabricated.

The MQW emission layer 5 in the light-emitting diode 100 generates blue light with a wavelength of 450 nm. The Si-doped GaN fluorescent layer 3 is excited by blue light from the MQW emission layer 5 and generates yellow light with a broad spectrum around 600 nm in wavelength as shown in FIG. 2.

Blue light with a wavelength of 450 nm generated in the MQW emission layer 5 and yellow light with a wavelength of about 600 nm generated in the Si-doped GaN fluorescent layer 3 are complement to each other on a chromaticity diagram. When blue light and yellow light, which are complement to each other, are observed from the side of the sapphire substrate 1 of the light-emitting diode 100, blue light and yellow light are mixed, and white light is observed as a result.

As above described, white light can be extracted readily from the side of the sapphire substrate 1 of the light-emitting diode 100 comprising the MQW emission layer 5 and the Si-doped GaN fluorescent layer 3.

A description is made about a method for fabricating a light-emitting diode 100 shown in FIG. 1. Layers 2–6 are grown respectively by MOCVD method on a sapphire substrate 1. As a source gas, for example, trimethylaluminum (TMAl), trimethylgallium (TMGa), trimethylindium (TMIn), ammonia ($NH_3$), silane gas ($SiH_4$), or cyclopentadienylmagnesium ($Cp_2Mg$) is used.

First, a buffer layer 2 composed of Al0.5Ga0.5N is grown to about 15 nm in thickness on C (0001) surface of the sapphire substrate 1 as keeping the substrate at 600° C. Next, a Si-doped GaN fluorescent layer 3 is grown to 1 μm on the buffer layer 2 as keeping the substrate at 1150° C.

A flow of $SiH_4$, which is to be supplied to grow the Si-doped GaN fluorescent layer 3 as a source of Si, is set approximately ten times as much as the flow to be supplied to the conventional Si-doped GaN fluorescent layer having sufficient good crystallinity under an appropriate growth condition.

While a flow of $SiH_4$ for the conventional Si-doped GaN fluorescent layer is 1.7 sccm, for example, the flow of $SiH_4$ for the Si-doped GaN fluorescent layer 3 of this embodiment is 17 sccm. An increase of the flow of $SiH_4$ produces the Si-doped GaN fluorescent layer 3 doped excessive amounts of Si, compared with the conventional Si-doped GaN fluorescent layer. Such a Si-doped GaN fluorescent layer 3 exhibits good fluorescent properties.

In the growth of the Si-doped GaN fluorescent layer 3, the mole ratio of a flow of $NH_3$ to a flow of TMGa (V/III) is set 5000 as same as that for the conventional Si-doped GaN having sufficient good crystallinity.

When the above described Si-doped GaN fluorescent layer 3 is excited by irradiating with He—Cd laser of 325 nm in wavelength, the Si-doped GaN fluorescent layer 3 generates yellow fluorescence having a broad spectrum around 600 nm in wavelength as shown in FIG. 2.

Then, an n-GaN layer 4 composed of Si-doped GaN is grown to 3 μm in thickness on the Si-doped GaN fluorescent layer 3 as keeping the substrate at 1150° C. Further, an MQW (multiple quantum well) emission layer 5 composed of InGaN is grown on the n-GaN layer 4 as keeping the substrate at 880° C.

The MQW emission layer 5 has a multiple quantum well (MQW) structure in which five undoped GaN barrier layers about 6 nm in thickness each and four undoped $In_{0.15}Ga_{0.85}N$ well layers about 3 nm in thickness each are laminated alternately.

Then, a p-GaN layer 6 composed of Mg-doped GaN is grown to 0.2 μm in thickness on the MQW emission layer 5 as keeping the substrate at 1150° C.

Although the p-GaN layer 6 is formed on the MQW emission layer 5 in this embodiment, the p-GaN layer 6 may also be formed on the p-AlGaN layer composed of Mg-doped AlGaN formed on the MQW emission layer 5.

Further, a film composed of Si oxide such as $SiO_2$ is formed over an entire surface of p-GaN layer 6 by ECR (electronic cyclotron resonance) plasma CVD or the like. In this embodiment, for example, the $SiO_2$ film is approximately 0.2 μm in thickness.

Furthermore, the $SiO_2$ film is partly removed by photolithography method and wet etching using BHF (buffer solution hydrogen fluoric acid) so that only the striped regions, approximately 250 μm in width each are left and the p-GaN layers 6 between the striped regions are exposed. In this manner, predetermined regions of the p-GaN layer 6 are masked with the SiO₂ films.

The regions, which are not masked with SiO₂ films, of the p-GaN layer 6 reaching to the n-GaN layer are removed to expose the n-GaN layer 4 by RIE (Reactive Ion Etching) using CF₄ or the like as etching gas. Then, SiO₂ films as masks are removed by hydrofluoric acid base etchant.

Then, an n-side electrode 8 is formed on the exposed n-GaN layer 4 by laminating, for example, a Ti film of 10 nm in thickness and an Al film of 500 nm in thickness in this order. And a p-side electrode 7 is formed on the p-GaN layer 6, for example, by laminating a Pd film of 30 nm in thickness and an Au film of 500 nm in thickness in this order.

As described above, the light-emitting diode 100 comprising the MQW emission layer 5 and the Si-doped GaN fluorescent layer 3 is fabricated.

The MQW emission layer 5 in the light-emitting diode 100 generates blue light with a wavelength of 450 nm. The Si-doped GaN fluorescent layer 3 is excited by blue light from the MQW emission layer 5 and generates yellow light with a broad spectrum around 600 nm in wavelength as shown in FIG. 2.

Blue light with a wavelength of 450 nm generated in the MQW emission layer 5 and yellow light with a wavelength of about 600 nm generated in the Si-doped GaN fluorescent layer 3 are complement to each other on a chromaticity diagram. When blue light and yellow light, which are complement to each other, are observed from the side of the sapphire substrate 1 of the light-emitting diode 100, blue light and yellow light are mixed, and white light is observed as a result.

As above described, white light can be extracted readily from the side of the sapphire substrate 1 of the light-emitting diode 100 comprising the MQW emission layer 5 and the Si-doped GaN fluorescent layer 3.

In this embodiment, the Si-doped GaN fluorescent layer 3 can grow in a same way as the other layers 2 and 4–6. So it is possible to grow each of layers 2–6 continuously in a same process during the fabrication of the light-emitting diode 100. Such a light-emitting diode can be manufactured readily, resulting in high yield and a low cost.

Each of layers 2–6 in the light-emitting diode 100 is composed of GaN base semiconductor materials, which are chemically stable. Thus each of layers 2–6 can be energized without deterioration, resulting in a long life and high reliability.

Although the temperature of the substrate is set at 1150° C. to grow the Si-doped GaN ii fluorescent layer 3 in this embodiment, which is the same temperature of the substrate in the growth of a conventional Si-doped GaN layer with sufficient good crystallinity, the temperature of the substrate may be set lower.

As described above, NH₃ and TMGa are supplied to grow the Si-doped GaN fluorescent layer 3. Although a mole ratio of a flow of NH₃ to TMGa (V/III) is set 5000 in the above embodiment, which is the same ratio for growing the conventional Si-doped GaN layer with sufficient good crystallinity, the mole ratio of V/III may be set smaller to grow the Si-dope GaN fluorescent layer 3.

Figure 3:
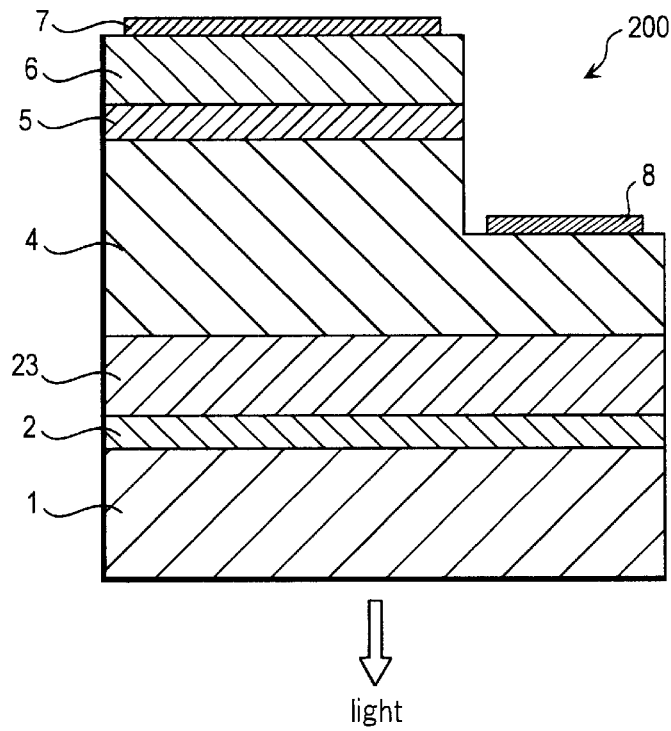
FIG. 3 is a cross sectional view schematically illustrating a light-emitting diode in a second embodiment according to the present invention.

FIG. 3 is a cross sectional view illustrating a light-emitting diode of a second embodiment in the present invention.

A light-emitting diode 200 shown in FIG. 3 has the same structure as the light-emitting diode 100 shown in FIG. 1 except that an undoped GaN fluorescent layer 23 of approximately 1 μm in thickness is formed, instead of the Si-doped GaN fluorescent layer 3. Such a light-emitting diode 200 is fabricated in the same method as the light-emitting diode 100 with the exceptions as follows.

In the fabrication of the light-emitting diode 200, an undoped GaN fluorescent layer 23 is grown to 1 μm in thickness as keeping a substrate at 1150° C. after forming a buffer layer 2.

When NH₃ and TMGa are supplied to grow the undoped GaN fluorescent layer 23, the mmole ratio of a flow of NH₃ to a flow of TMGa (V/III) is set smaller than that for the conventional undoped GaN layer with sufficient good crystallinity.

While the mole ratio of a flow of NH₃ to TMGa (V/III) is set 5000 to grow the conventional undoped GaN layer having sufficient good crystallinity, the mole ratio (V/III) may be set 2000 to grow the undoped GaN fluorescent layer 23. The undoped GaN fluorescent layer 23 fabricated in this manner exhibits good fluorescent properties.

When the undoped GaN fluorescent layer 23 is excited by irradiating He—Cd laser, as shown in FIG. 2, the undoped GaN fluorescent layer 23 generates yellow fluorescence with a broad spectrum around 600 nm in a wavelength.

The MQW emission layer 5 in the light-emitting diode 200 emits blue light with a wavelength of 450 nm. The undoped GaN fluorescent layer 23 is excited by the blue light generated in the MQW emission layer 5 and, as shown in FIG. 2, emits yellow light with a broad spectrum around 600 nm in a wavelength.

Blue light with a wavelength of 450 nm generated in the MQW emission layer 5 and yellow light with a wavelength of about 600 nm generated in the undoped GaN fluorescent layer 23 are complement to each other on a chromaticity diagram. When blue light and yellow light, which are complement to each other, are observed from the side of the sapphire substrate 1 of the light-emitting diode 200, blue light and yellow light are mixed, and white light is observed as a result.

As above described, white light can be extracted readily from the side of the sapphire substrate 1 of the light-emitting diode 200 comprising the MQW emission layer 5 and the undoped GaN fluorescent layer 23.

In this embodiment, the undoped GaN fluorescent layer 23 can grow in a same way as the other layers 2 and 4–6. So it is possible to grow each of layers 2, 23, 4–6 continuously in a same process during the fabrication of the light-emitting diode 200. Such a light-emitting diode 200 can be manufactured readily, resulting in high yield and a low cost.

Each of layers 2, 23, 4–6 in the light-emitting diode 200 is composed of GaN base semiconductor materials, which are chemically stable. Thus each of layers 2, 23, 4–6 can be energized without deterioration, resulting in a long life and high reliability.

Although the temperature of the substrate is set at 1150° C. to grow the undoped GaN fluorescent layer 23 in this embodiment, which is same temperature of the substrate in growing a conventional Si-doped GaN layer with sufficient good crystallinity, the temperature of the substrate may be set lower.

Figure 4:
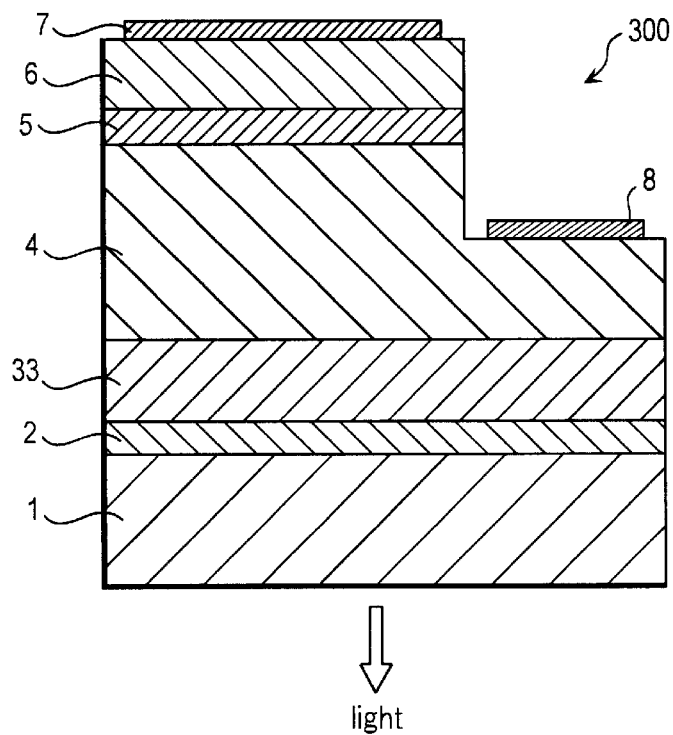
FIG. 4 is a cross sectional view schematically illustrating a light-emitting diode in a third embodiment according to the present invention.

FIG. 4 is a cross sectional view illustrating a light-emitting diode of a third embodiment in the present invention.

A light-emitting diode 300 shown in FIG. 4 has the same structure as the light-emitting diode 100 shown in FIG. 1 except that a C (carbon)-doped GaN fluorescent layer 33 of approximately 1 μm in thickness is formed, instead of the Si-doped GaN fluorescent layer 3. Such a light-emitting diode 300 is fabricated in the same method as the light-emitting diode 100 with the exceptions as follows.

In the fabrication of the light-emitting diode 300, a C-doped GaN fluorescent layer 33 is grown to 1 μm in thickness as keeping a substrate at temperature of 1150° C. after forming a buffer layer 2.

In order to grow the C-doped GaN fluorescent layer 33, $CH_4$ of 10 sccm, which is carbon source, is supplied as well as $NH_3$ and TMGa. The mole ratio of a flow of $NH_3$ to a flow of TMGa (V/III) is set 5000. The C-doped fluorescent layer fabricated in this manner exhibits good fluorescent properties.

When the C-doped GaN fluorescent layer 33 is excited by irradiating He—Cd laser, as shown in FIG. 2, the C-doped GaN fluorescent layer 33 generates yellow fluorescence with a broad spectrum around 600 nm in a wavelength.

The MQW emission layer 5 in the light-emitting diode 300 emits blue light with a wavelength of 450 nm. The C-doped GaN fluorescent layer 33 is excited by the blue light generated in the MQW emission layer 5 and, as shown in FIG. 2, emits yellow light with a broad spectrum around 600 nm in a wavelength.

Blue light with a wavelength of 450 nm generated in the MQW emission layer 5 and yellow light with a wavelength of about 600 nm generated in the C-doped GaN fluorescent layer 33 are complement to each other on a chromaticity diagram. When blue light and yellow light, which are complement to each other, are observed from the side of the sapphire substrate 1 of the light-emitting diode 300, blue light and yellow light are mixed, and white light is observed as a result.

As above described, white light can be extacted readily from the side of the sapphire substrate 1 of the light-emitting diode 300 comprising the MQW emission layer 5 and the C-doped GaN fluorescent layer 33.

In this embodiment, the C-doped GaN fluorescent layer 33 can grow in a same way as the other layers 2 and 4–6. So it is possible to grow each of layers 2, 33, 4–6 continuously in a same process during the fabrication of the light-emitting diode 300. Such a light-emitting diode 300 can be manufactured readily, resulting in high yield and a low cost.

Each of layers 2, 33, 4–6 in the light-emitting diode 300 is composed of GaN base semiconductor materials, which are chemically stable. Thus each of layers 2, 33, 4–6 can be energized without deterioration, resulting in a long life and high reliability.

Although the temperature of the substrate is set at 1150° C. to grow the C-doped GaN fluorescent layer 33 in this embodiment, which is same temperature of the substrate in the growth of a conventional Si-doped GaN layer with sufficient good crystallinity, the temperature of the substrate may be set lower.

As described above, $NH_3$ and TMGa are supplied to grow the C-doped GaN fluorescent layer 33. Although a mole ratio of a flow of $NH_3$ to TMGa (V/III) is set 5000 in the above embodiment, which is same ratio for growing the conventional Si-doped GaN layer with sufficient good crystallinity, the mole ratio of V/III may be set smaller to grow the C-dope GaN fluorescent layer 33.

In the first, second, and third embodiments, the GaN fluorescent layers 3, 23, 33 are grown under the conditions which do not meet the most favorable conditions for growing the GaN layer with sufficient good crystallinity in order to obtain good fluorescent properties. That may cause insufficient crystallinity of the GaN fluorescent layers 3, 23, 33. Thus, each layer 4–6, especially the MQW emission layer 5, on the GaN fluorescent layers 3, 23, 33 may have insufficient crystallinity.

A description will be made about a light-emitting diode in which crystallinity of each layer except for the GaN fluorescent layer is improved, as follows.

Figure 5:
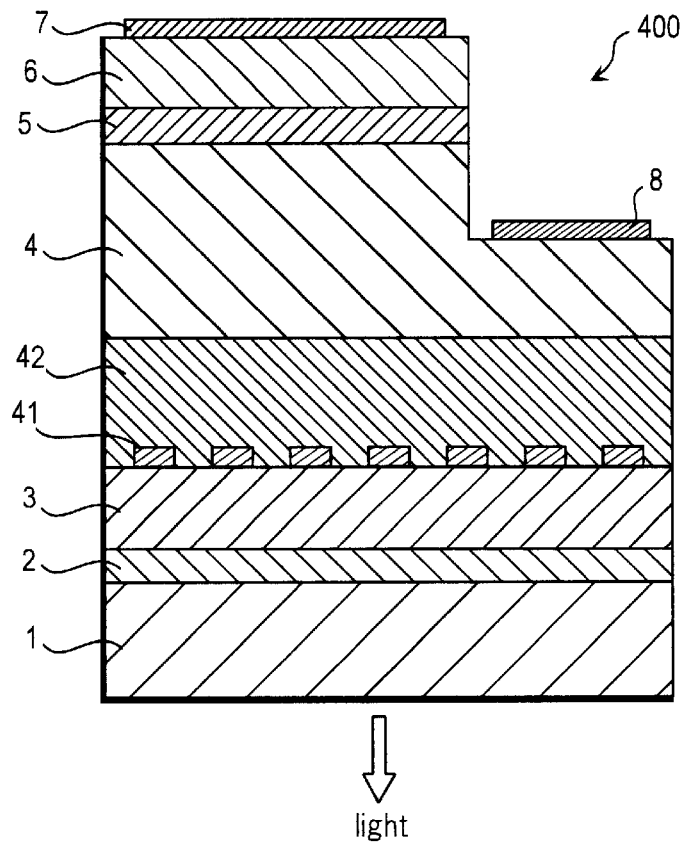
FIG. 5 is a cross sectional view schematically illustrating a light-emitting diode in a fourth embodiment according to the present invention.

FIG. 5 is a cross sectional view illustrating a light-emitting diode of a fourth embodiment in the present invention.

A light-emitting diode 400 shown in FIG. 5 has the same structure as the light-emitting diode 100 shown in FIG. 1 except that an undoped GaN fluorescent layer 42 is selectively formed on the Si-doped fluorescent layer 3 by epitaxial lateral overgrowth method using an $SiO_2$ film 41.

Specifically speaking, a plurality of $SiO_2$ films 41 are formed in striped shapes in the predetermined regions on the Si-doped GaN fluorescent layer 3 of the light-emitting diode 400. The $SiO_2$ films 41 are 2–10 μm each in width and spaced 2–10 μm apart.

In this embodiment, for example, the $SiO_2$ films 41 are 200 nm each in thickness, 8 μm each in width and spaced 4 μm apart. Such stripe-shaped $SiO_2$ films 41 are formed along the [11–20] direction or the [1–100] direction on the Si-doped GaN fluorescent layer 3.

An undoped GaN fluorescent layer 42 of 10 μm in thickness is formed on the stripe-shaped $SiO_2$ films 41 and the Si-doped GaN fluorescent layer 3 exposed between the $SiO_2$ films 41 by a method to be described later. An n-GaN layer 4 of 3 μm in thickness is formed on the undoped GaN fluorescent layer 42.

Such a light-emitting diode 400 is fabricated in the same method as the light-emitting diode 100 with the exceptions as follows.

In the fabrication of the light-emitting diode 400, a Si-doped GaN fluorescent layer 3 is formed in the same method for the light-emitting diode 100. Then, a $SiO_2$ film 41 is formed to 0.2 μm in thickness over the entire upper surface of the Si-doped GaN fluorescent layer 3.

Further, $SiO_2$ film is partly removed by photolithography method and wet etching using BHF (buffer solution hydrogen fluoric acid) so that only the striped regions, approximately 8 μm in width each are left with 12 μm spacing. Thus, a plurality of $SiO_2$ films 41 are formed in striped shapes on the Si-doped GaN fluorescent layer 3 and the Si-doped GaN fluorescent layer 3 between the stripe-shaped $SiO_2$ films 41 is exposed.

Furthermore, the undoped GaN fluorescent layer 42 is grown to about 10 μm by the MOCVD method on the stripe-shaped $SiO_2$ films 41 and the Si-doped GaN fluorescent layer 3 exposed between the films 41 as keeping the substrate at 1150° C.

In the growth of the undoped GaN fluorescent layer 42, the undoped GaN is selectively grown on the Si-doped GaN fluorescent layer 3 exposed between the $SiO_2$ films. As the undoped GaN grows, so grow the undoped GaN further in a lateral direction on the Si-doped GaN fluorescent layer 3. Consequently, the undoped GaN is formed on the $SiO_2$ films 41. As above described, the undoped GaN fluorescent layer 42 is formed on the $SiO_2$ films 41 and the Si-doped GaN fluorescent layer 3 which is exposed between the $SiO_2$ films.

In this embodiment, dislocations propagated from the Si-doped GaN fluorescent layer 3 to the undoped GaN fluorescent layer 42 bend in the lateral direction following the epitaxial lateral overgrowth of the undoped GaN on the SiO$_2$ films 41. Therefore, dislocations are not propagated to regions above the SiO$_2$ films 41 in the undoped GaN fluorescent layer 42.

The undoped GaN fluorescent layer 42 can obtain good crystallinity due to the reduction of dislocations propagated from the Si-doped fluorescent layer 3, resulting in good crystallinity in each layer 4–6 formed on the undoped GaN fluorescent layer 42.

Like the light-emitting diode 100, the MQW emission layer 5 in the light-emitting diode 400 generates blue light with a wavelength of 450 nm. The Si-doped GaN fluorescent layer 3 is excited by blue light from the MQW emission layer 5 and generates yellow light with a broad spectrum around 600 nm in wavelength as shown in FIG. 2.

Like the light-emitting diode 100, blue light generated in the MQW emission layer 5 and yellow light generated in the Si-doped GaN fluorescent layer 3 of the light-emitting diode 400 are complement to each other on a chromaticity diagram. When blue light and yellow light are observed from the side of the sapphire substrate 1 of the light-emitting diode 400, blue light and yellow light are mixed, and white light is observed as a result.

As above described, white light can be extracted readily from the side of the sapphire substrate 1 of the light-emitting diode 400 comprising the MQW emission layer 5 and the Si-doped GaN fluorescent layer 3.

In this embodiment, the Si-doped GaN fluorescent layer 3 can grow in a same way as the other layers 2, 42 and 4–6.

Each of the layers 2, 3, 42, 4–6 in the light-emitting diode 400 is composed of GaN base semiconductor materials, which are chemically stable. Thus each of layers 2, 3, 42, 4–6 can be energized without deterioration, resulting in a long life and high reliability.

The undoped GaN fluorescent layer 42 of the light-emitting diode 400 can recover its crystallinity by selective epitaxial lateral overgrowth method, resulting in improving crystallinity of each layer 4–6 formed on the undoped GaN fluorescent layer 42. Hence the reliability and device properties of the light-emitting diode 400 are improved, which allow the MQW emission layer 5 to generate more intensive light. Consequently, the light-emitting diode 400 can emit more intensive white light.

Although the undoped GaN fluorescent layer 42, in this embodiment, is selectively formed by epitaxial lateral overgrowth method on the Si-doped GaN fluorescent layer 3 in the first embodiment, it can be selectively formed by epitaxial lateral overgrowth method on the undoped GaN fluorescent layer 23 in the second embodiment as well as the C-doped GaN fluorescent layer 33 in the third embodiment. All of them can produce same effect.

Figure 6:
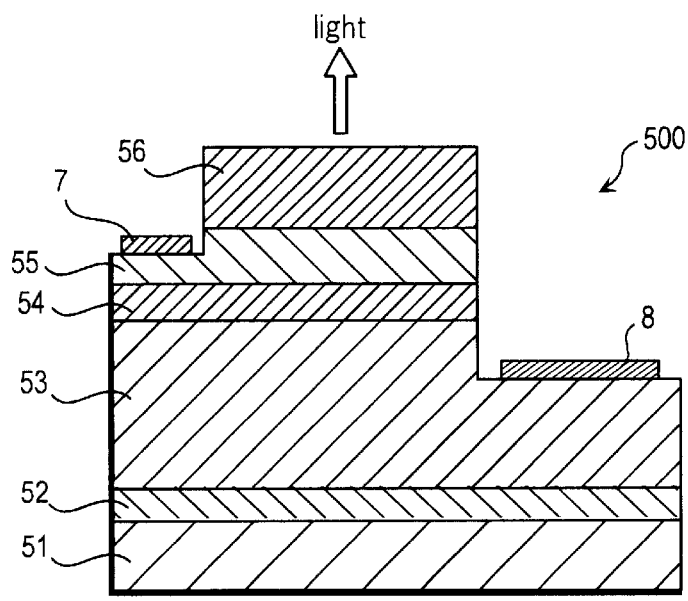
FIG. 6 is a cross sectional view schematically illustrating a light-emitting diode in a fifth embodiment according to the present invention.

FIG. 6 is a cross sectional view illustrating a light-emitting diode of a fifth embodiment in the present invention. A light-emitting diode 500 shown in FIG. 6 is fabricated in the following manner.

A buffer layer 52 composed of Al$_{0.5}$Ga$_{0.5}$N, an n-GaN layer 53 composed of Si-doped GaN, an MQW emission layer 54 composed of InGaN and a p-GaN layer 55 composed of Mg-doped GaN are grown on C (0001) surface of the sapphire substrate 51 in this order.

Each of layers 52–55 grows in a same way as the other layers 2, 4–6 in the light-emitting diode 100 of FIG. 1. A p-AlGaN layer composed of Mg-doped AlGaN may be formed between the MQW emission layer 54 and the p-GaN layer 55.

Then, a Si-doped GaN fluorescent layer 56 is grown on the p-GaN layer 55 in the same way for growing the Si-doped GaN fluorescent layer 3 of the light-emitting diode 100.

Specifically, a flow of SiH$_4$, which is to be supplied to grow the Si-doped GaN fluorescent layer 56 as a source of Si, is set approximately ten times as much as the flow to be supplied to the conventional Si-doped GaN having sufficient good crystallinity under the most favorable growth condition. The Si-doped GaN fluorescent layer 56 is doped with Si excessively by increasing a flow of SiH$_4$, compared with the conventional Si-doped GaN layer. Such a Si-doped GaN fluorescent layer 56 exhibits good fluorescent properties.

When the Si-doped GaN fluorescent layer 56 is excited by irradiating He—Cd laser of 325 nm in wavelength, as shown in FIG. 2, the Si-doped GaN fluorescent layer 56 generates yellow fluorescence with a broad spectrum around 600 nm in a wavelength.

In the growth of the Si-doped GaN fluorescent layer 56, the mole ratio of a flow of NH$_3$ to a flow of TMGa (V/III) is set 5000 as same as that for the conventional Si-doped GaN having sufficient good crystallinity.

In this embodiment, the Si-doped GaN fluorescent layer 56 is formed on the p-GaN layer 55 under the conditions which do not meet the most favorable conditions for forming the Si-doped GaN layer with sufficient good crystallinity. Because of this, the Si-doped GaN fluorescent layer 56 has no effect of its crystallinity on each of layers 53–55. Consequently, the layers 53–55 including the MQW emission layer 54 realize good crystallinity.

After the Si-doped GaN fluorescent layer 56 is grown, predetermined regions of the n-GaN layer 53 are exposed by etching and removing a part from the Si-doped GaN fluorescent layer 56 to the n-GaN layer 53. An n-side electrode 8 is formed on the exposed n-GaN layer 53.

Then predetermined region of the p-GaN layer 55 are exposed by etching and removing a part from the Si-doped GaN fluorescent layer 56 to the p-GaN layer 55. A p-side electrode 7 is formed on the exposed p-GaN layer 55.

The MQW emission layer 54 in the light-emitting diode 500 emits blue light with a wavelength of 450 nm. On the other hand, the Si-doped GaN fluorescent layer 56 is excited by the blue light generated in the MQW emission layer 54 and, as shown in FIG. 2, emits yellow light with a broad spectrum around 600 nm in a wavelength.

Blue light with a wavelength of 450 nm generated in the MQW emission layer 54 and yellow light with a wavelength of about 600 nm generated in the Si-doped GaN fluorescent layer 56 are complement to each other on a chromaticity diagram. When blue light and yellow light, which are complement to each other, are observed from the side of the Si-doped GaN fluorescent layer 56 of the light-emitting diode 500, blue light and yellow light are mixed, and white light is observed as a result.

As above described, white light can be extracted readily from the side of the Si-doped GaN fluorescent layer 56 of the light-emitting diode 500 comprising the MQW emission layer 54 and the Si-doped GaN fluorescent layer 56.

In this embodiment, the Si-doped GaN fluorescent layer 56 can grow in a same way as the other layers 52–55. So it is possible to grow each of the layers 52–56 continuously in a same process during the fabrication of the light-emitting diode 500. Such a light-emitting diode 500 can be manufactured readily, resulting in high yield and a low cost.

Each of layers 52–56 in the light-emitting diode 500 is composed of GaN base semiconductor materials, which are chemically stable. Thus each of layers 52–56 can be energized without deterioration, resulting in a long life and high reliability.

In the fabrication of the light-emitting diode 500, the Si-doped GaN fluorescent layer 56 is grown after the layers 52–55 including the MQW emission layer 54 are grown. Thus each of the layers 52–55, especially the MQW emission layer 54, are not affected by crystallinity of the Si-doped GaN fluorescent layer 56 and can have good crystallinity. Consequently, the reliability and device properties of the light-emitting diode 500 are improved, which allow the MQW emission layer 54 to generate more intensive light. Thus, the light-emitting diode 500 can emit more intensive white light.

In this embodiment, the Si-doped GaN fluorescent layer 56, which is same as the Si-doped GaN fluorescent layer 3, is grown as a fluorescent layer. But the undoped GaN fluorescent layer, which is same as the undoped GaN fluorescent layer 23 in the second embodiment, may be formed instead of the Si-doped GaN fluorescent layer 56. Also the C-doped GaN fluorescent layer, which is same as the C-doped GaN fluorescent layer 33 in the third embodiment, may be formed.

In the fabrication of the light-emitting diodes 100, 200, 300, 400, 500 in the first to fifth embodiments, though each layer is grown by MOCVD method, the other methods for crystal growth such as MBE (molecular Beam Epitaxy), CBE (Chemical Beam Epitaxy) or the like may be used.

The structures of each layer of the light-emitting diodes 100, 200, 300, 400, 500 in the first to fifth embodiments are not limited to those as described above. Each layer may be composed of nitride base semiconductors including at lease one of Ga, Al, In, B, and Tl.

For example, the emission layer and the fluorescent layer may be composed of $(Al_xGa_{1-x})_yIn_{1-y}N(0 \leq x \leq 1, 0 \leq y \leq 1)$. The emission layer including such compositions can be arbitrarily set to emit light with a wavelength in the range of 380–650 nm by controlling the compositions. On the other hand, the compositions of the fluorescent layer are set so that the fluorescent layer emits light having a wavelength complemented to that of light from the emission layer.

As shown in the first to fifth embodiments, it is preferable that the fluorescent layer is composed of Si-doped GaN, undoped GaN or C-doped GaN, because the fluorescent layer can generate intensive yellow light having a wavelength of 520–650 nm.

Although the sapphire substrates 1 and 51 are used, the other substrates are also available.

The light-emitting diodes 100, 200, 300, 400, 500 in the first to fifth embodiments may be provided with highly reflective films composed of high reflective materials on a surface opposite to a surface for extracting white light.

For example, the highly reflective film may be formed on the upper surface of the p-side electrode 7, the n-side electrode 8, the exposed p-GaN layer 6 and the exposed n-GaN layer 4 of the light-emitting diodes 100, 200, 300, 400 in the first to fourth embodiments. Consequently, more intensive light can be extracted from the side of the sapphire substrate 1.

On the other hand, the highly reflective film may be formed on a surface opposite to a surface for growing crystals of the sapphire substrate 51 in the light-emitting diode 500 of the fifth embodiment. Consequently, more intensive light can be extracted from the side of the Si-doped GaN fluorescent layer 56.

Although white light is extracted from the side of the sapphire substrate 1 in the first to fourth embodiments, white light also can be extracted from the side of the p-side electrode when the p-side electrode is translucent material and the highly reflective film is formed on the lower surface of the sapphire substrate 1. Although white light is extracted from the side of the Si-doped GaN fluorescent layer 56 in the fifth embodiment, white light can be extracted from the side of the sapphire substrate when the highly reflective film is formed on the upper surface of the Si-doped GaN fluorescent layer.

In the first to fifth embodiments, the n-type semiconductor layer and the p-type semiconductor layer are formed on the sapphire substrate in this order. It is also possible to form the p-type semiconductor layer and the n-type semiconductor layer on the sapphire substrate in this order.

For example, the p-type semiconductor layer, the emission layer, and the n-type semiconductor layer may be formed in this order on the GaN fluorescent layers 3, 23, 33 of the first to fourth embodiments. Also the p-type semiconductor layer, the emission layer, the n-type semiconductor layer and the GaN fluorescent layer 56 may be formed in this order on the buffer layers 52 of the fifth embodiment.

The description was made about the present invention including the first to fifth embodiments for the light-emitting diode applications. The invention is also applicable to other types of semiconductor light-emitting devices such as a surface light-emitting laser device or the like instead of the light-emitting diode.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What I claim is:

1. A semiconductor light-emitting device comprising a layer structure including:

an emission layer composed of a group III nitride base semiconductor and generating light by carrier injection, and a fluorescent layer composed of the group III nitride base semiconductor and generating light by excitation from the light generated in the emission layer, wherein the light generated in the emission layer is different in a peak wavelength from the light generated in the fluorescent layer.

2. The semiconductor light-emitting device according to claim 1, wherein the light generated in the emission layer is the complementary color for the light generated in the fluorescent layer.

3. The semiconductor light-emitting device according to claim 1, wherein the emission layer and the fluorescent layer are so placed that the light generated in the emission layer passes through the fluorescent layer and is extracted.

4. The semiconductor light-emitting device according to claim 1, wherein the emission layer is formed on the fluorescent layer; and the light generated in the fluorescent layer and the light generated in the emission layer are extracted from a side of the fluorescent layer.

5. The semiconductor light-emitting device according to claim 1, wherein the fluorescent layer is formed on the emission layer; and the light generated in the emission layer and the light generated in the fluorescent layer are extracted from a side of the fluorescent layer.

6. The semiconductor light-emitting device according to claim 1, where the group III nitride base semiconductor includes at least one of aluminum, gallium and indium.

7. The semiconductor light-emitting device according to claim 1, wherein the fluorescent layer is composed of silicon-doped gallium nitride.

8. The semiconductor light-emitting device according to claim 1, wherein the fluorescent layer is composed of carbon-doped gallium nitride.

9. The semiconductor light-emitting device according to claim 1, wherein the fluorescent layer is composed of undoped gallium nitride.

* * * * *